(12) United States Patent
Han et al.

(10) Patent No.: US 9,450,213 B1
(45) Date of Patent: Sep. 20, 2016

(54) DEVICE AND METHOD FOR TRANSFERRING DISPLAY PANEL

(71) Applicants: BOE TECHNOLOGY GROUP CO., LTD., Beijing (CN); ORDOS YUANSHENG OPTOELECTRONICS CO., LTD., Ordos (CN)

(72) Inventors: Yuebai Han, Beijing (CN); Xiaopeng Bai, Beijing (CN); Shanshan Bao, Beijing (CN); Xinxin Jin, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 14/744,416

(22) Filed: Jun. 19, 2015

(30) Foreign Application Priority Data

Feb. 28, 2015 (CN) .......................... 2015 1 0090749

(51) Int. Cl.
| | |
|---|---|
| H01L 51/56 | (2006.01) |
| G02F 1/1335 | (2006.01) |
| G02F 1/13 | (2006.01) |
| G21K 5/10 | (2006.01) |
| H01L 21/02 | (2006.01) |
| G02F 1/1333 | (2006.01) |

(52) U.S. Cl.
CPC ............ *H01L 51/56* (2013.01); *G02F 1/1303* (2013.01); *G02F 1/133509* (2013.01); *G21K 5/10* (2013.01); *H01L 21/0231* (2013.01); *G02F 2001/133322* (2013.01)

(58) Field of Classification Search
CPC ...... H01L 21/0231; G21K 5/08; G21K 5/10; G02F 1/1333; G02F 1/133322; G02F 1/133509; G02F 1/133512; G02F 1/1339
See application file for complete search history.

(56) References Cited

U.S. PATENT DOCUMENTS

| | | | | |
|---|---|---|---|---|
| 5,978,065 | A * | 11/1999 | Kawasumi | G02F 1/1339 349/188 |
| 7,902,567 | B2 * | 3/2011 | Oh | H05B 33/22 257/100 |
| 7,972,192 | B2 * | 7/2011 | Song | G02F 1/1303 445/6 |
| 8,289,466 | B2 * | 10/2012 | Matsuhira | G02F 1/1339 349/158 |
| 9,366,908 | B2 * | 6/2016 | Xiong | G02F 1/133753 |
| 2004/0075380 | A1 * | 4/2004 | Takemoto | H01L 51/5259 313/500 |
| 2014/0118230 | A1 * | 5/2014 | Lim | H01L 51/524 345/82 |

(Continued)

FOREIGN PATENT DOCUMENTS

| | | |
|---|---|---|
| CN | 102331637 A | 1/2012 |
| CN | 202337514 U | 7/2012 |

(Continued)

OTHER PUBLICATIONS

First Chinese Office Action regarding Application No. 2015100907494 dated May 30, 2016. Translation provided by Dragon Intellectual Property Law Firm.

*Primary Examiner* — Jack Berman
(74) *Attorney, Agent, or Firm* — Harness, Dickey & Pierce, P.L.C.

(57) ABSTRACT

The present disclosure provides a device and a method for transferring a display panel. The device includes a carrier configured to transfer the display panel, and a light-shielding plate secured onto the carrier and configured to shield a display region of the display panel when the display panel enters an irradiation region.

19 Claims, 3 Drawing Sheets

(56) References Cited

U.S. PATENT DOCUMENTS

| | | |
|---|---|---|
| 2014/0139798 A1 | 5/2014 | Xu |
| 2015/0160485 A1 | 6/2015 | Li et al. |
| 2015/0309344 A1* | 10/2015 | Huang .................. G02F 1/1339 445/25 |
| 2016/0020432 A1* | 1/2016 | Yu ....................... H01L 27/3272 257/40 |

FOREIGN PATENT DOCUMENTS

| | | | | |
|---|---|---|---|---|
| CN | 103293743 A | * | 9/2013 | ........... G02F 1/1339 |
| CN | 203417836 U | | 2/2014 | |
| CN | 103777406 A | | 5/2014 | |
| CN | 104133324 A | | 11/2014 | |
| CN | 204052088 U | | 12/2014 | |
| CN | 104353597 A | | 2/2015 | |

\* cited by examiner

DEVICE AND METHOD FOR TRANSFERRING DISPLAY PANEL

CROSS-REFERENCE TO RELATED APPLICATION

The present application claims a priority of the Chinese patent application No. 201510090749.4 filed on Feb. 28, 2015, which is incorporated herein by reference in its entirety.

TECHNICAL FIELD

The present disclosure relates to the field of display technology, in particular to a device and a method for transferring a display panel.

BACKGROUND

An existing active-matrix organic light-emitting diode (AMOLED) display panel is usually packaged with a silicon sealant, so as to be isolated from water and oxygen from atmosphere in an effective manner, thereby to prevent corrosion of an organic electroluminescent layer. However, for the display panel packaged with the silicon sealant, a packaging substrate will be readily separated from an array substrate due to the inadequate packaging strength. Hence, generally a ultraviolet (UV) glue is permeated through a non-Pad side of the display panel that has been cut, so as to improve the packaging strength of the two substrates.

As shown in FIG. 1, when the UV glue is being cured, it is required to expose the AMOLED display panel 2 on a carrier 3 to a UV source 1. However, a material with a relatively small work function in the array substrate of the AMOLDE display panel will be greatly affected by a UV light beam which has a small wavelength and high energy. Hence, during the production, usually the UV glue is cured with the array substrate facing downward and the packaging substrate facing upward. When the packaging substrate faces upward, an electroluminescent material will be directly exposed to the UV light beam, resulting in an adverse influence on the electroluminescent material. Meanwhile, the UV light beam will pass through the packaging substrate and reach the array substrate, so a display region of the display panel will be adversely affected to some extent no matter how the display panel is placed.

In order to reduce this adverse influence as possible, usually it is required to reduce an exposure time of the UV light beam. However, the reduction in the exposure time will be adverse to a curing effect of the UV glue.

SUMMARY

An object of the present disclosure is to provide a device and a method for transferring a display panel, so as to prevent a display region of the display panel from being exposed to a UV light beam when a UV glue is being cured, and increase the intensity of the UV light beam in an appropriate manner during the curing, thereby to improve a curing effect of the UV glue while reducing an exposure time to the UV light beam.

In one aspect, the present disclosure provides in one embodiment a device for transferring a display panel, including:

a carrier configured to transfer the display panel; and a light-shielding plate secured onto the carrier and configured to shield a display region of the display panel when the display panel enters an irradiation region.

Further, the device includes:

a plurality of locators arranged on the carrier and configured to locate the display panel, so that the display region of the display panel located by the locators is completely shielded by the light-shielding plate when the light-shielding plate moves to a predetermined position.

Further, the locators are locating columns.

Further, the device includes:

a movable support arranged on the carrier and configured to support the light-shielding plate; and a cylinder connected to the movable support and configured to drive the movable support to move so that the light-shielding plate is capable of moving above the carrier.

Further, the light-shielding plate is of a size identical to the display region of the display panel.

Further, the light-shielding plate is of a size greater than the display region of the display panel, and configured to shield a pad region of the display panel.

Further, the carrier moves in a first direction, and the light-shielding plate moves in a second direction perpendicular to the first direction.

Further, the irradiation region is a region irradiated by a UV light beam.

In another aspect, the present disclosure provides in one embodiment a method for transferring a display panel for use in the above-mentioned device, including a step of:

shielding a display region of the display panel with a light-shielding plate when the display panel is transferred by a carrier into an irradiation region.

Further, prior to transferring the display panel by the carrier into the irradiation region, the method includes a step of:

placing the display panel onto the carrier, locating the display panel with locators, and vacuum-adsorbing the display panel by the carrier so as to secure the display panel.

Further, the locators are locating columns.

Further, the step of shielding the display region of the display panel with the light-shielding plate includes:

driving a movable support with a cylinder, so as to move the light-shielding plate from an initial position to a predetermined position, and shield the display region of the display panel.

Further, subsequent to transferring the display panel by the carrier out of the irradiation region, the method includes a step of:

driving the movable support with the cylinder, so as to move the light-shielding plate from the predetermined position to the initial position, and move the display panel away from the carrier.

Further, the irradiation region is a region irradiated by a UV light beam.

According to the embodiments of the present disclosure, the light-shielding plate is arranged above the carrier for transferring the display panel, and when the display panel enters the irradiation region so as to cure the UV glue, the display region of the display panel is shielded by the light-shielding plate, so as to prevent the display region from being exposed to the UV light beam, thereby to protect the display region. Meanwhile, due to the light-shielding plate, it is able to increase the intensity of the UV light beam in an appropriate manner during the curing, thereby to improve a curing effect of the UV glue while reducing an exposure time to the UV light beam.

DETAILED DESCRIPTION

Figure 1:
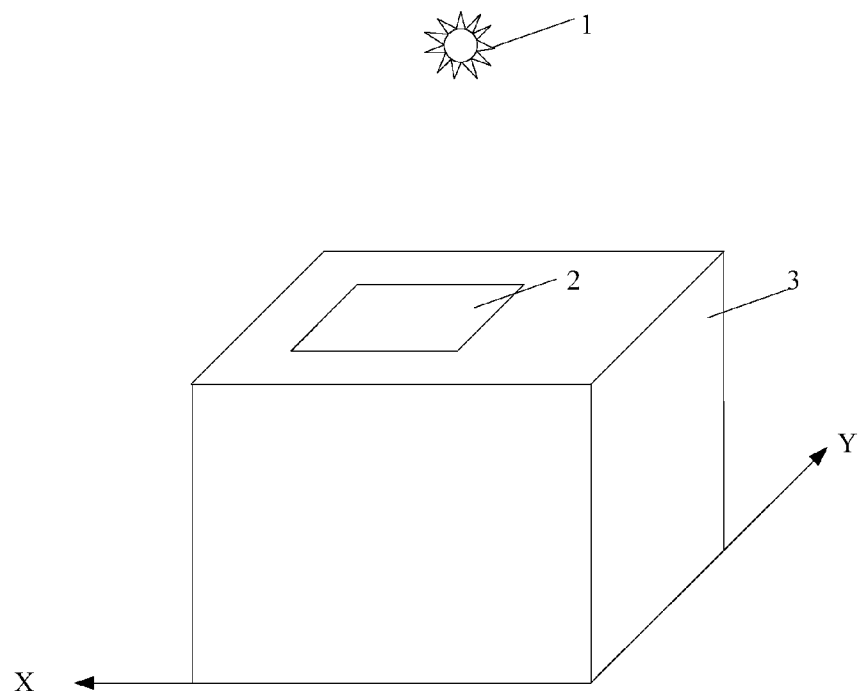
FIG. 1 is a schematic view showing an existing device for transferring a display panel with a carrier.

The present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The present disclosure provides in the embodiments a device and a method for transferring a display panel, so as to prevent a display region of the display panel from being exposed to a UV light beam when a UV glue is being cured, and increase the intensity of the UV light beam in an appropriate manner during the curing, thereby to improve a curing effect of the UV glue while reducing an exposure time to the UV light beam.

First Embodiment

The present disclosure provides in this embodiment a device for transferring a display panel, including:

a carrier configured to transfer the display panel; and a light-shielding plate secured onto the carrier and configured to shield a display region of the display panel when the display panel enters an irradiation region of UV light beams.

According to this embodiment, the light-shielding plate is arranged above the carrier for transferring the display panel, and when the display panel enters the irradiation region so as to cure the UV glue, the display region of the display panel is shielded by the light-shielding plate, so as to prevent the display region from being exposed to the UV light beam, thereby to protect the display region. Meanwhile, due to the light-shielding plate, it is able to increase the intensity of the UV light beam in an appropriate manner during the curing, thereby to improve a curing effect of the UV glue while reducing an exposure time to the UV light beam.

Further, the device includes a plurality of locators arranged on the carrier and configured to locate the display panel, so that the display region of the display panel located by the locators is completely shielded by the light-shielding plate when the light-shielding plate moves to a predetermined position.

To be specific, the locator may be a locating column.

Further, the device includes:

a movable support arranged on the carrier and configured to support the light-shielding plate; and a cylinder connected to the movable support and configured to drive the movable support to move so that the light-shielding plate is capable of moving above the carrier. To be specific, the light-shielding plate may move at a plane parallel to a surface of the carrier.

Further, when the light-shielding plate is parallel to the surface of the carrier at the predetermined position and a UV source is located right above the light-shielding plate, the light-shielding plate may be of a size identical to the display region of the display panel. When there is an angle between the light-shielding plate at the predetermined position and the surface of the carrier, the light-shielding plate may be of a size slightly greater than the display region of the display panel, as long as the display region of the display panel may be shielded by the light-shielding plate.

Further, the light-shielding plate is of a size greater than the display region of the display panel, so that both the display region and a pad region of the display region are shielded by the light-shielding plate when the light-shielding plate at the predetermined position is parallel to, or angled relative to, the surface of the carrier.

Alternatively, the carrier may move in a first direction, and the light-shielding may move in a second direction perpendicular to the first direction. When the display panel is placed on the carrier, pad region of the display panel is arranged in the second direction and facing an initial position of the light-shielding plate. When the light-shielding plate is located at the predetermined position, it may merely shield the display region of the display panel, or may shield both the display region and the pad region of the display panel.

Second Embodiment

The present disclosure provides in this embodiment a method for transferring a display panel for use in the above-mentioned device. The method includes a step of:

shielding the display region of the display panel with the light-shielding plate when the display panel is transferred by the carrier into the irradiation region of UV beams.

According to this embodiment, when the display panel enters the irradiation region so as to cure the UV glue, the display region of the display panel is shielded by the light-shielding plate, so as to prevent the display region from being exposed to the UV light beam, thereby to protect the display region. Meanwhile, due to the light-shielding plate, it is able to increase the intensity of the UV light beam in an appropriate manner during the curing, thereby to improve a curing effect of the UV glue while reducing an exposure time to the UV light beam.

Further, prior to transferring the display panel by the carrier into the irradiation region of UV beams, the method includes a step of:

placing the display panel onto the carrier, locating the display panel with the locators, and vacuum-adsorbing the display panel by the carrier so as to secure the display panel.

Further, the step of shielding the display region of the display panel with the light-shielding plate includes:

driving the movable support with the cylinder, so as to move the light-shielding plate from the initial position to the predetermined position, and shield the display region of the display panel.

Further, subsequent to transferring the display panel by the carrier out of the irradiation region, the method includes a step of:

driving the movable support with the cylinder, so as to move the light-shielding plate from the predetermined position to the initial position, and move the display panel away from the carrier.

Third Embodiment

The device for transferring the display panel in this embodiment will be described hereinafter in conjunction with the drawings by taking an AMOLED display panel as an example.

As shown in FIGS. 2-5, the device in this embodiment includes a carrier 3 for transferring the AMOLED display panel 2. A plurality of locators, e.g., locating columns 5, is arranged on the carrier 3, so as to locate the AMOLED display panel 2. A movable support 6 is arranged at a side of the carrier 3 and driven by a cylinder. A light-shielding plate 4 is secured onto a top end of the movable support 6, and the movable support 6 is driven by the cylinder so that the light-shielding plate 4 moves in a direction parallel to a surface of the carrier 3. The light-shielding plate 4 is of a size identical to a display region of the AMOLED display panel 2 and slightly less than the AMOLED display panel 2. When the light-shielding plate 4 moves to a predetermined position, the display region of the AMOLED display panel 2 located by the locating columns 5 is located right below the light-shielding plate 4.

To be specific, the carrier 3 in this embodiment moves along a Y-axis direction, so as to transfer the AMOLED display panel 2. The light-shielding plate 4 may move along an X-axis direction, or the Y-axis direction.

Figure 2:
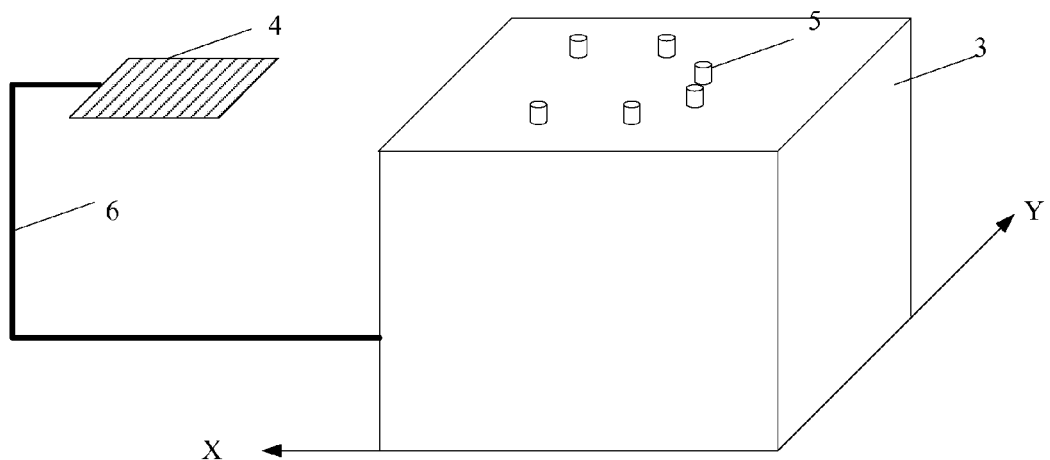
FIG. 2 is a schematic view showing a device for transferring a display panel according to one embodiment of the present disclosure.

Before transferring the AMOLED display panel 2, as shown in FIG. 2, the light-shielding plate 4 is located at an initial position, and the locating columns 5 are in an open state.

Figure 3:
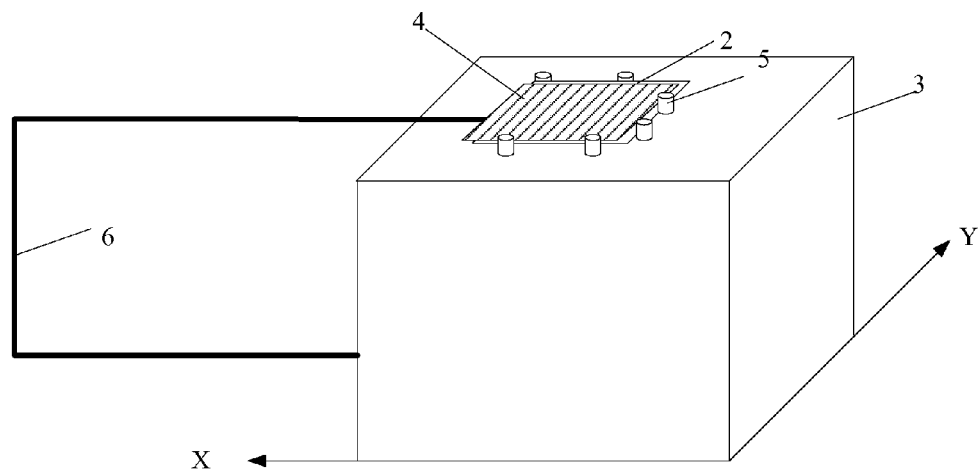
FIG. 3 is a schematic view showing a situation where a display region of the display panel is shielded by a light-shielding plate before the display panel is exposed to a UV light beam according to one embodiment of the present disclosure.

During the transferring of the AMOLED display panel 2, the carrier 3 at first moves along the Y-axis direction to a position where the AMOLED display panel 2 is to be loaded. As shown in FIG. 3, the AMOLED display panel 2 may be placed on the carrier 3 by a conveyor belt or a mechanical arm. The AMOLED display panel 2 is located by the locating columns 5, and then vacuum-adsorbed by the carrier 3 so as to be secured onto the carrier 3. The movable support 6 is driven by the cylinder so that the light-shielding plate 4 moves from the initial position to the predetermined position and is located right above the display region of the AMOLED display panel 2. The AMOLED display panel 2 includes three non-pad sides and one pad side. Among them, two non-pad sides are located in a width direction of the AMOLED display panel 2, and the remaining non-pad side and the pad-side are located in a length direction of the AMOLED display panel 2. The light-shielding plate 4 is of a width less than the AMOLED display panel 2. The three non-pad sides, are coated with the UV glue, the pad side is not coated with the UV glue, so when the UV glue is cured by the UV light beam, it is unnecessary to expose the pad side of the AMOLED display panel 2 to the UV light beam. At this time, the pad side may be located at a position facing the initial position of the light-shielding plate 4. Because the light-shielding plate 4 is of a width less than the AMOLED display panel 2, the two non-pad sides in the width direction of the AMOLED display panel 2 may not be shielded. In addition, when the light-shielding plate 4 is located at the predetermined position, it may merely shield the pad side of the AMOLED display panel 2, rather than the non-pad side in the length direction of the AMOLED display panel 2.

Figure 4:
FIG. 4 is a schematic view showing a situation where the display panel is exposed to the UV light beam according to one embodiment of the present disclosure.
Figure 4:
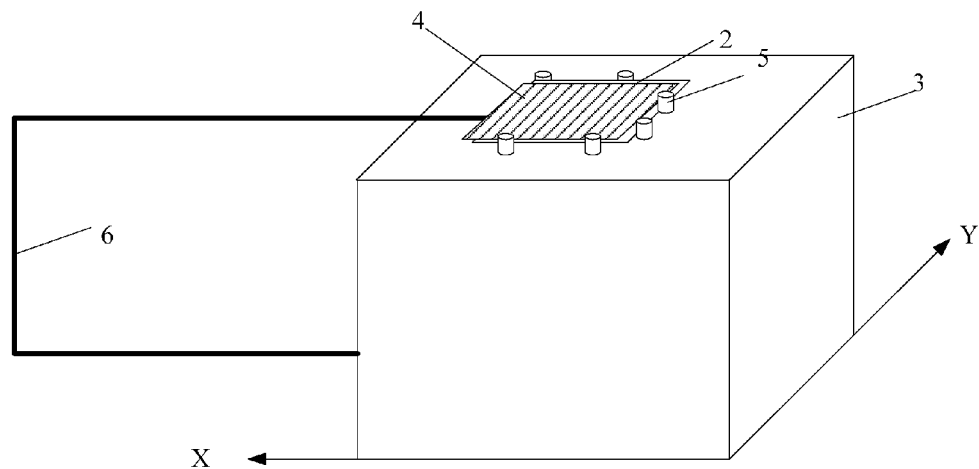

Then, as shown in FIG. 4, the carrier 3 adsorbs the AMOLED display panel 2 and moves together with the light-shielding plate 4 in the Y-axis direction into an irradiation region of the UV beam. At this time, the display region of the AMOLED display panel 2 is protected by the light-shielding plate 4. The three non-pad sides of the AMOLED display panel 2 are exposed to the UV light beam so as to cure the UV glue coated thereto, thereby to improve the packaging strength of an array substrate and a packaging substrate.

Figure 5:
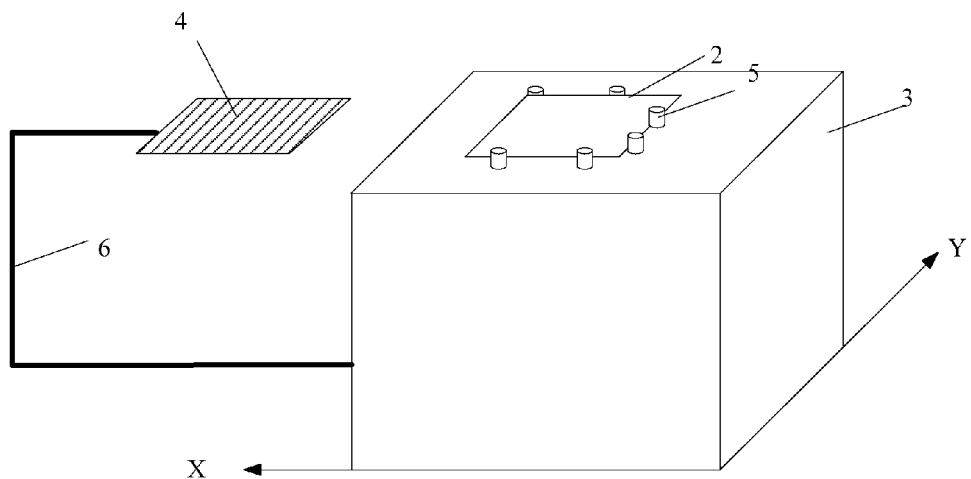
FIG. 5 is a schematic view showing a situation where the light-shielding plate is moved away and the display panel is not shielded by the light-shielding plate after the display panel has been exposed to the UV light beam according to one embodiment of the present disclosure.

After the UV glue has been cured, as shown in FIG. 5, the carrier 3 moves along the Y-axis direction out of the irradiation region, and the light-shielding plate 4 moves back to the initial position. At a position where the AMOLED display panel is to be unloaded, the AMOLED display panel 2 is moved away from the carrier 3 by a conveyor belt or a mechanical arm. In this way, the entire curing procedure for the UV glue of the AMOLED display panel 2 has been completed.

Then, the carrier 3 moves back along the Y-axis direction, and at the position where the AMOLED display panel is to be loaded, a new AMOLED display panel is placed onto the carrier 3 and the UV glue thereof may be cured as mentioned above.

According to this embodiment, the light-shielding plate is arranged above the carrier, and when the UV glue of the AMOLED display panel is being cured, it is able to prevent the display region of the AMOLED display panel from being exposed to the UV light beam, thereby to protect the display region. Meanwhile, due to the light-shielding plate, it is able to increase the intensity of the UV light beam in an appropriate manner during the curing, thereby to improve a curing effect of the UV glue while reducing an exposure time to the UV light beam.

Fourth Embodiment

The device for transferring the display panel in this embodiment will be described hereinafter in conjunction with the drawings by taking the AMOLED display panel as an example.

Figure 6:
FIG. 6 is a schematic view showing the device for transferring the display panel according to another embodiment of the present disclosure.
Figure 6:
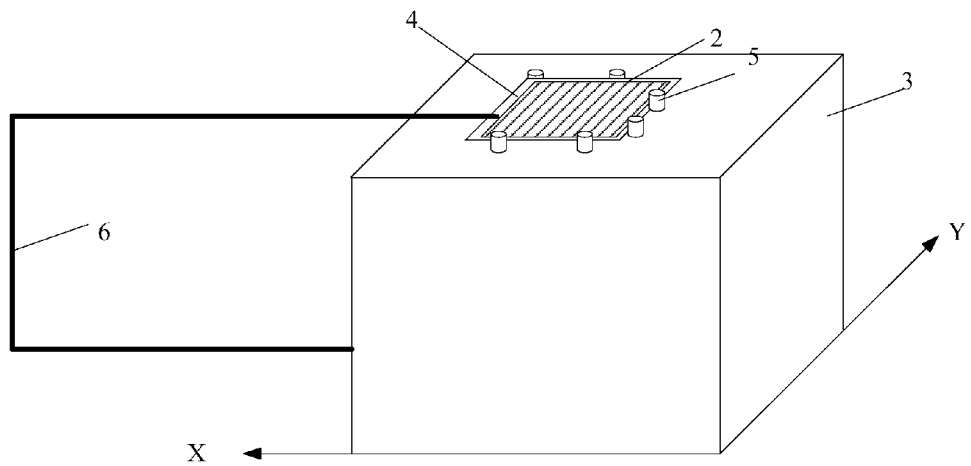

As shown in FIG. 6, the device in this embodiment includes the carrier 3 for transferring the AMOLED display panel 2. A plurality of locating columns 5 is arranged on the carrier 3 so as to locate the AMOLED display panel 2. The movable support 6 is arranged at a side of the carrier 3 and driven by the cylinder. The light-shielding plate 4 is secured onto a top end of the movable support 6, and the movable support 6 is driven by the cylinder so as to move the light-shielding plate 4 in a direction parallel to the surface of the carrier 3. The light-shielding plate 4 is of a size identical to the display region of the AMOLED display panel 2 and slightly less than the AMOLED display panel 2. When the light-shielding plate 4 moves to the predetermined position, the display region of the AMOLED display panel 2 located by the locating columns 5 is located right below the light-shielding plate 4.

To be specific, the carrier 3 in this embodiment moves along the Y-axis direction so as to transfer the AMOLED display panel 2. The light-shielding plate 4 may move along the X-axis direction or the Y-axis direction.

Before transferring the AMOLED display panel 2, the light-shielding plate 4 is located at the initial position, and the locating columns 5 are in the open state.

During the transferring of the AMOLED display panel 2, the carrier at first moves along the Y-axis direction to the position where the AMOLED display panel is to be loaded. The AMOLED display panel 2 may be placed onto the carrier 3 by a conveyor belt or a mechanical arm. The AMOLED display panel 2 is located by the locating columns 5, and then vacuum-adsorbed by the carrier 3 so as to secure it onto the carrier 3. Next, the locating columns 5 are moved to release the AMOLED display panel 2. The movable support 6 is driven by the cylinder so that the light-shielding plate 4 moves from the initial position to the predetermined position and is located right above the display region of the AMOLED display panel 2. The AMOLED display panel 2 includes three non-pad sides which are coated with the UV glues, and one pad side. Because the light-shielding plate 4 is of a width and a length less than the AMOELD display panel 2, the three non-pad sides and the pad side of the AMOLED display panel 2 are not shielded by the light-shielding plate 4.

Then, as shown in FIG. 6, the carrier 3 adsorbs the AMOLED display panel 2 and moves together with the light-shielding plate 4 along the Y-axis direction into the irradiation region of the UV beam. At this time, the display region of the AMOLED display panel 2 is protected by the light-shielding plate 4. The three non-pad sides of the AMOLED display panel 2 is exposed to the UV light beam, so it is able to cure the UV glue, thereby to improve the packaging strength of the array substrate and the packaging substrate.

After the UV glue has been cured, the carrier 3 moves along the Y-axis direction out of the irradiation region of the UV beam, and the light-shielding plate 4 moves back to the initial position. At the position where the AMOLED display panel is to be unloaded, the AMOLED display panel 2 is moved away from the carrier 3 by a conveyor belt or a mechanical arm. In this way, the entire curing procedure for the UV glue of the AMOLED display panel 2 has been completed.

Then, the carrier 3 moves back along the Y-axis direction. At the position where the AMOLED display panel is to be loaded, a new AMOLED display panel is placed onto the carrier 3 and the UV glue thereof may be cured as mentioned above.

According to this embodiment, the light-shielding plate is arranged above the carrier, and when the UV glue of the AMOLED display panel is being cured, it is able to prevent the display region of the AMOLED display panel from being exposed to the UV light beam, thereby to protect the display region. Meanwhile, due to the light-shielding plate, it is able to increase the intensity of the UV light beam in an appropriate manner during the curing, thereby to improve a curing effect of the UV glue while reducing an exposure time to the UV light beam.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A device for transferring a display panel, comprising:
a carrier configured to transfer the display panel; and
a light-shielding plate secured onto the carrier and configured to shield a display region of the display panel when the display panel enters an irradiation region.

2. The device according to claim 1, further comprising:
a plurality of locators arranged on the carrier and configured to locate the display panel, so that the display region of the display panel located by the locators is completely shielded by the light-shielding plate when the light-shielding plate moves to a predetermined position.

3. The device according to claim 1, wherein the locators are locating columns.

4. The device according to claim 1, further comprising:
a movable support arranged on the carrier and configured to support the light-shielding plate; and
a cylinder connected to the movable support and configured to drive the movable support to move so that the light-shielding plate is capable of moving above the carrier.

5. The device according to claim 1, wherein the light-shielding plate is of a size identical to that of the display region of the display panel.

6. The device according to claim 1, wherein the light-shielding plate is of a size greater than that of the display region of the display panel, and configured to shield a pad region of the display panel.

7. The device according to claim 1, wherein the carrier moves in a first direction, and the light-shielding plate moves in a second direction perpendicular to the first direction.

8. The device according to claim 2, wherein the carrier moves in a first direction, and the light-shielding plate moves in a second direction perpendicular to the first direction.

9. The device according to claim 3, wherein the carrier moves in a first direction, and the light-shielding plate moves in a second direction perpendicular to the first direction.

10. The device according to claim 4, wherein the carrier moves in a first direction, and the light-shielding plate moves in a second direction perpendicular to the first direction.

11. The device according to claim 5, wherein the carrier moves in a first direction, and the light-shielding plate moves in a second direction perpendicular to the first direction.

12. The device according to claim 6, wherein the carrier moves in a first direction, and the light-shielding plate moves in a second direction perpendicular to the first direction.

13. The device according to claim 1, wherein the irradiation region is a region irradiated by a UV light beam.

14. A method for transferring a display panel, for use in the device according to claim 1, comprising a step of:

shielding a display region of the display panel with a light-shielding plate when the display panel is transferred by a carrier into an irradiation region.

15. The method according to claim 14, further comprising, prior to transferring the display panel by the carrier into the irradiation region, a step of:
placing the display panel onto the carrier, locating the display panel with locators, and vacuum-adsorbing the display panel by the carrier so as to secure the display panel.

16. The method according to claim 15, wherein the locators are locating columns.

17. The method according to claim 14, wherein the step of shielding the display region of the display panel with the light-shielding plate comprises:
driving a movable support with a cylinder, so as to move the light-shielding plate from an initial position to a predetermined position, and shield the display region of the display panel.

18. The method according to claim 14, further comprising, subsequent to transferring the display panel by the carrier out of the irradiation region, a step of:
driving the movable support with the cylinder, so as to move the light-shielding plate from the predetermined position to the initial position, and move the display panel away from the carrier.

19. The method according to claim 14, wherein the irradiation region is a region irradiated by a UV light beam.

* * * * *